(12) United States Patent
Wan et al.

(10) Patent No.: US 12,484,283 B2
(45) Date of Patent: Nov. 25, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Wei Wan, Hefei (CN); Shuai Zhang, Hefei (CN); Chunyu Xiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 496 days.

(21) Appl. No.: 18/151,438

(22) Filed: Jan. 8, 2023

(65) Prior Publication Data

US 2023/0154993 A1 May 18, 2023

Related U.S. Application Data

(63) Continuation of application No. PCT/CN2022/092962, filed on May 16, 2022.

(30) Foreign Application Priority Data

Sep. 26, 2021 (CN) .......................... 202111130025.X

(51) Int. Cl.
| | |
|---|---|
| *H10D 64/27* | (2025.01) |
| *H10B 12/00* | (2023.01) |
| *H10D 64/01* | (2025.01) |
| *H10D 64/66* | (2025.01) |
| *H10D 64/68* | (2025.01) |

(52) U.S. Cl.
CPC ........... *H10D 64/513* (2025.01); *H10B 12/34* (2023.02); *H10D 64/01* (2025.01); *H10D 64/679* (2025.01); *H10D 64/687* (2025.01)

(58) Field of Classification Search
CPC .. H10D 64/513; H10D 64/679; H10D 64/687; H10D 84/0126; H10D 30/699; H10B 12/34
See application file for complete search history.

(56) References Cited

U.S. PATENT DOCUMENTS 10,134,740 B2 * 11/2018 Kim ...................... H10B 12/053
11,211,466 B2 * 12/2021 Kwon .................... H10B 12/31
(Continued)

FOREIGN PATENT DOCUMENTS

| CN | 207068870 U | 3/2018 |
|---|---|---|
| CN | 111508841 A | 8/2020 |

*Primary Examiner* — Joseph C. Nicely
(74) *Attorney, Agent, or Firm* — Kilpatrick Townsend & Stockton LLP

(57) ABSTRACT

Embodiments relate to a semiconductor structure and a method for fabricating the same. The semiconductor structure includes: a base substrate including a trench, where the trench includes a gate structure whose top surface is lower than a top surface of the trench; first etch stop layers, where the first etch stop layers cover the top surface of the gate structure, part of a side wall of the trench, and an upper surface of the base substrate; an enclosed isolation structure positioned between the first etch stop layers in the trench, where the enclosed isolation structure at least plugs an opening of the trench; and an air gap positioned between the first etch stop layer and the enclosed isolation structure, where the air gap at least includes a transverse portion, and a bottom of the enclosed isolation structure is positioned on the transverse portion.

17 Claims, 11 Drawing Sheets

(56) References Cited

U.S. PATENT DOCUMENTS

2018/0145080 A1* 5/2018 Kim .................... H10D 62/115
2019/0295889 A1* 9/2019 Bai ................... H01L 21/76804
2020/0203351 A1* 6/2020 Chae .................... H10D 64/513

* cited by examiner

SEMICONDUCTOR STRUCTURE AND METHOD FOR FABRICATING SAME

CROSS-REFERENCE TO RELATED APPLICATION

The present disclosure is a continuation of PCT/CN2022/092962, filed on May 16, 2022, which claims priority to Chinese Patent Application No. 202111130025.X titled "SEMICONDUCTOR STRUCTURE AND METHOD FOR FABRICATING SAME" and filed to the State Patent Intellectual Property Office on Sep. 26, 2021, the entire contents of which are incorporated herein by reference.

TECHNICAL FIELD

The present disclosure relates to the field of semiconductor device manufacturing technology, and more particularly, to a semiconductor structure and a method for fabricating the same.

BACKGROUND

A dynamic random access memory (DRAM) is a semiconductor memory widely used in mobile phones, computers, automobiles and other electronic products. Difficulty of manufacture procedures of the DRAM is related to a dimension. The smaller the dimension is, the greater the difficulty is. A manufacturing technology of the DRAM will be around 10 nm to 15 nm in future, which has very strict electrical requirements for products.

Under a traditional process technology in which a buried gate is 10 nm to 15 nm, it is difficult to effectively isolate active areas on two sides of the gate, and also there exists a coupling effect between the gate and other metal layers, which has a serious adverse effect on electrical properties of semiconductor devices.

SUMMARY

According to various embodiments of the present disclosure, a semiconductor structure and a method for fabricating the same are provided.

According to some embodiments, a first aspect of the present disclosure provides a semiconductor structure. The semiconductor structure includes: a base substrate, which includes a trench therein, where a top surface of the gate structure is lower than a top surface of the trench; first etch stop layers, where the first etch stop layers cover the top surface of the gate structure, part of a side wall of the trench, and an upper surface of the base substrate; an enclosed isolation structure positioned between the first etch stop layers in the trench, where the enclosed isolation structure at least plugs an opening of the trench; and an air gap positioned between the first etch stop layer and the enclosed isolation structure, where the air gap at least includes a transverse portion, and a bottom of the enclosed isolation structure is positioned on the transverse portion.

According to some embodiments, a second aspect of the present disclosure discloses a method for fabricating a semiconductor structure. The method includes: providing a base substrate, where the base substrate comprises a trench, a gate structure is formed in the trench, and a top surface of the gate structure is lower than a top surface of the trench; forming first etch stop layers, where the first etch stop layers cover the top surface of the gate structure, part of a side wall of the trench, and an upper surface of the base substrate; and forming an enclosed isolation structure and an air gap in the trench, where the enclosed isolation structure is configured to at least plug an opening of the trench, and the air gap is positioned between the enclosed isolation structure and each of the first etch stop layers. The air gap at least comprises a transverse portion, and a bottom of the enclosed isolation structure is positioned on the transverse portion.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that disclosed contents of the present disclosure are understood more thoroughly and completely.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

When describing a positional relationship, unless otherwise specified, when an element such as a layer or base substrate is referred to as being "on" another film layer, it may be directly on the other film layer or an intervening film layer may also be present. Further, when a layer is referred to as being "under" another layer, it may be directly under the other layer, or one or more intervening layers may also be present. It is also to be understood that when a layer is referred to as being "between" two layers, it may be the only one between the two layers, or one or more intervening layers may also be present.

In the case of "comprising", "having", and "including" as described herein, another component may also be added unless a clearly defined term is used, such as "only", "consisting of", etc. Unless mentioned to the contrary, terms in the singular form may include the plural form and cannot be understood as one in number.

In the description of the present disclosure, it is to be noted that unless specified or limited otherwise, terms "connecting" or "connection" should be understood in a broad sense, which may be, for example, a fixed connection, a detachable connection or integrated connection, a direct connection or an indirect connection by means of an intermediary, or internal communication between two components. For those of ordinary skill in the art, concrete meanings of the above terms in the present disclosure may be understood based on concrete circumstances.

In addition, in the description of the present disclosure, unless otherwise specified, "a plurality of", "mutually", "superimposed", "stacked" and "multiple" mean two or more.

Figure 1:
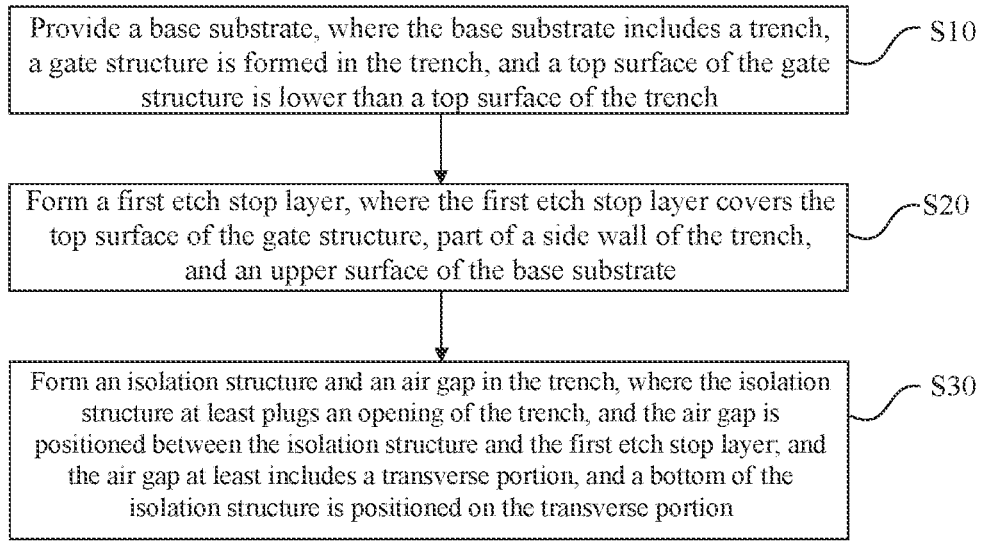
FIG. 1 is a flow block diagram of a method for fabricating a semiconductor structure according to an embodiment of the present disclosure.

As shown in FIG. 1, one embodiment of the present disclosure discloses a method for fabricating a semiconductor structure. The method includes: S10: providing a base substrate, where the base substrate comprises a trench, a gate structure is formed in the trench, and a top surface of the gate structure is lower than a top surface of the trench; S20: forming first etch stop layers, where the first etch stop layers cover the top surface of the gate structure, part of a side wall of the trench, and an upper surface of the base substrate; and S30: forming an isolation structure and an air gap in the trench, where the isolation structure is configured to at least plug an opening of the trench, and the air gap is positioned between the isolation structure and each of the first etch stop layers. The air gap at least comprises a transverse portion, and a bottom of the isolation structure is positioned on the transverse portion.

According to the above method for fabricating the semiconductor structure, by providing the air gap in the trench where the buried gate is positioned, the active areas on the two sides of the gate are better isolated by using the characteristics of minimum dielectric constant and good isolation effect of air, thereby reducing the coupling effect between the adjacent metal gates. Moreover, because the air gap is provided with the transverse portion, the area of air isolation and the width of transverse isolation may be increased, such that the isolation effect between the gate structure and other metal wires (such as the metal layers) may be improved, and the coupling effect is lower.

In Step S10, the provided substrate includes trenches, where number of the trenches may be one or more. For example, the step of forming the base substrate includes following steps.

Figure 2:
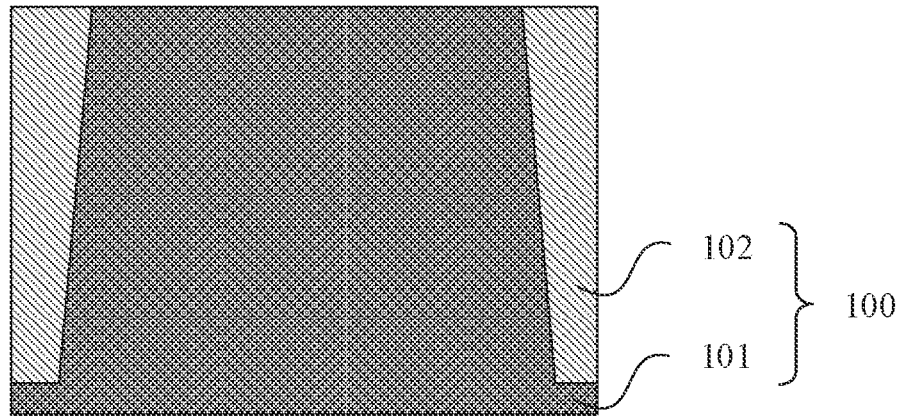
FIG. 2 is a schematic cross-sectional structural diagram of a base substrate according to one embodiment of the present disclosure.

S11: providing a substrate 101, the substrate 101 including an active area, wherein an isolation structure 102 is arranged around the active area, and the substrate 101 and the isolation structure 102 jointly constitute a base substrate 100, as shown in FIG. 2.

For example, the substrate 101 in this embodiment includes, but is not limited to, a silicon substrate 101. The isolation structure 102 surrounding the active area includes, but is not limited to, a shallow trench isolation trench.

Figure 3:
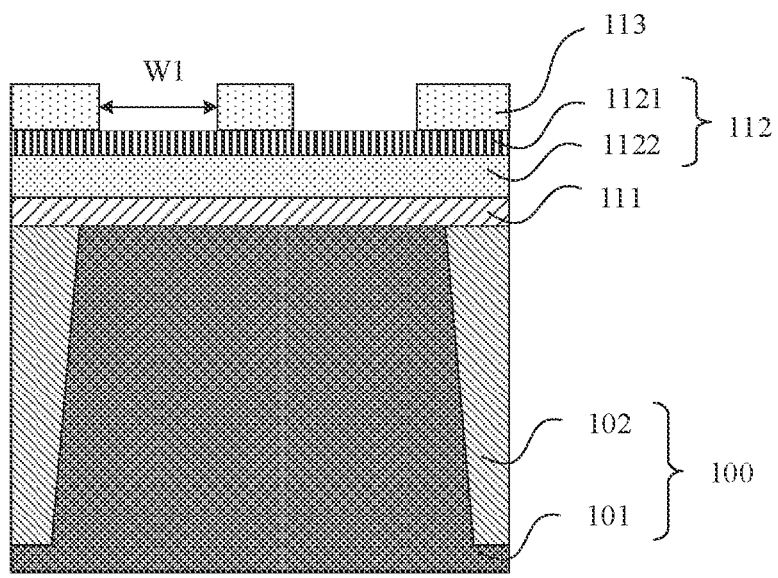
FIG. 3 is a schematic cross-sectional structural diagram of a semiconductor structure obtained after an initial etch stop layer, a mask layer and a patterned photoresist layer are sequentially formed on an upper surface of a substrate according to one embodiment of the present disclosure.

S12: forming an initial etch stop layer 111, a mask layer 112, and a patterned photoresist layer 113 in sequence on the upper surface of the substrate 101, wherein an opening pattern configured to define a shape and a location of a trench 114 is formed in the patterned photoresist layer 113, as shown in FIG. 3.

For example, the initial etch stop layer 111 includes, but is not limited to, a silicon nitride layer. The mask layer 112 may be one or more of an SION layer, a Carbon layer (amorphous carbon layer), a spin-on carbon (SOC) layer, a $SiO_2$ layer, and a dielectric anti-reflected coating (DARC) layer; and the mask layer 112 has a thickness of 50 nm to 200 nm, such as 50 nm, 100 nm, 150 nm, 175 nm, or 200 nm. In this embodiment, the mask layer 112 includes a Carbon layer 1121 and a silicon oxynitride layer 1122 sequentially stacked from bottom to top. For example, the initial etch stop layer 111 and the mask layer 112 may be fabricated by means of a physical vapor deposition process, a chemical vapor deposition process, or an atomic layer deposition process, and the like.

The patterned photoresist layer 113 is configured to define a dimension, a shape and a location of the trench. An opening pattern in the patterned photoresist layer 113 may be directly determined by means of illumination, or may be defined by means of illumination first, and then implemented by means of a method of pitch double. A concrete implementation may be determined according to a width W1 of the buried gate. For example, the width W1 may range from 5 nm to 80 nm, such as 5 nm, 15 nm, 35 nm, 60 nm, or 80 nm.

S13: etching the mask layer 112 and the initial etch stop layer 111 on the basis of the patterned photoresist layer 113.

Figure 4:
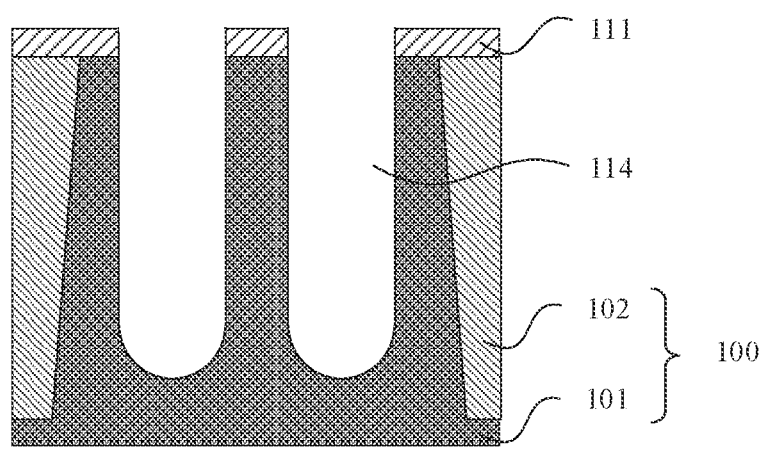
FIG. 4 is a schematic cross-sectional structural diagram of a semiconductor structure obtained after a trench is formed according to one embodiment of the present disclosure.

S14: etching the substrate 101 on the basis of the mask layer 112 etched and the initial etch stop layer 111 etched to form the trench 114, as shown in FIG. 4.

For example, the opening pattern in the patterned photoresist layer 113 is defined by means of illumination, and the opening pattern exposes part of the upper surface of the mask layer 112. The opening pattern is then formed in the mask layer 112 and the initial etch stop layer 111 in sequence. The substrate 101 is etched on the basis of the opening pattern in the initial etch stop layer 111 to form the trench 114 as shown in FIG. 4.

After the trench 114 is formed, a gate structure is formed in the trench 114. For example, the step of forming the gate structure in the trench 114 includes following steps.

Figure 5:
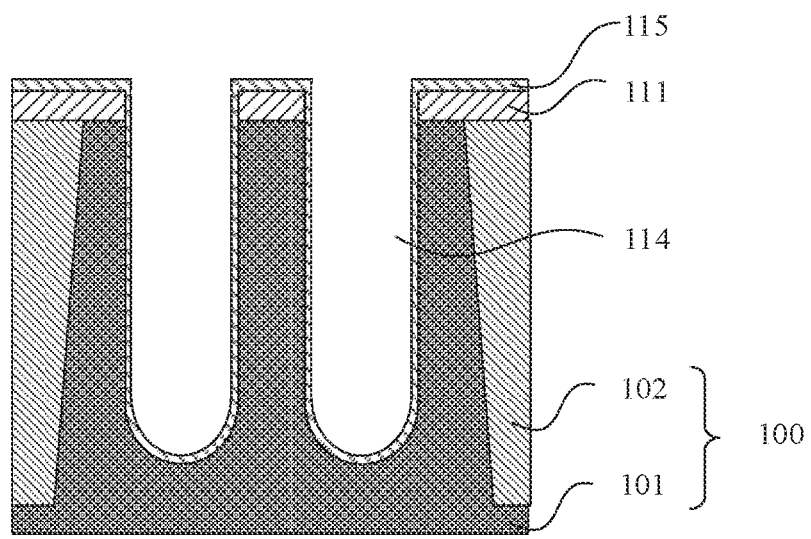
FIG. 5 is a schematic cross-sectional structural diagram of a semiconductor structure obtained after a gate oxide layer is formed according to one embodiment of the present disclosure.

S15: forming a gate oxide material layer 115 on the base substrate 100 and the side wall and bottom of the trench 114, as shown in FIG. 5.

Figure 6:
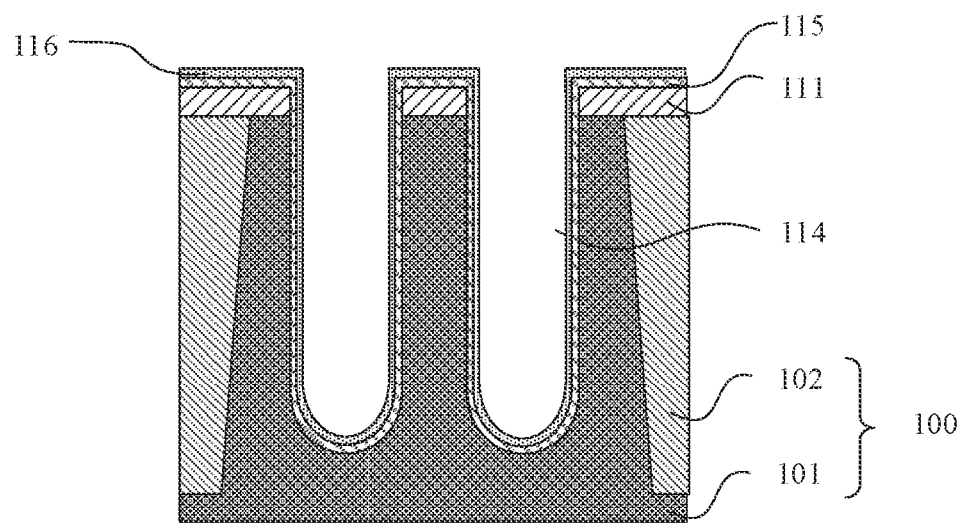
FIG. 6 is a schematic cross-sectional structural diagram of a semiconductor structure obtained after a stop material layer is formed according to one embodiment of the present disclosure.

S16: forming a stop material layer 116, where the stop material layer 116 covers the gate oxide material layer 115, as shown in FIG. 6.

In some embodiments, the gate oxide material layer 115 includes, but is not limited to, an oxide layer, such as a silicon dioxide layer. The stop material layer 116 includes, but is not limited to, a titanium nitride layer. The thickness of the gate oxide material layer 115 and the thickness of the stop material layer 116 are 1 nm to 10 nm, such as 1 nm, 5 nm, or 10 nm. The gate oxide material layer 115 is formed by means of a thermal oxidation process, and the stop material layer 116 is formed by means of a physical vapor deposition process, a chemical vapor deposition process, or an atomic layer deposition process. In some embodiments, the gate oxide material layer 115 may also be formed by means of the atomic layer deposition process. Therefore, the gate oxide material layer 115 may also cover the initial etch stop layer 111.

Figure 7:
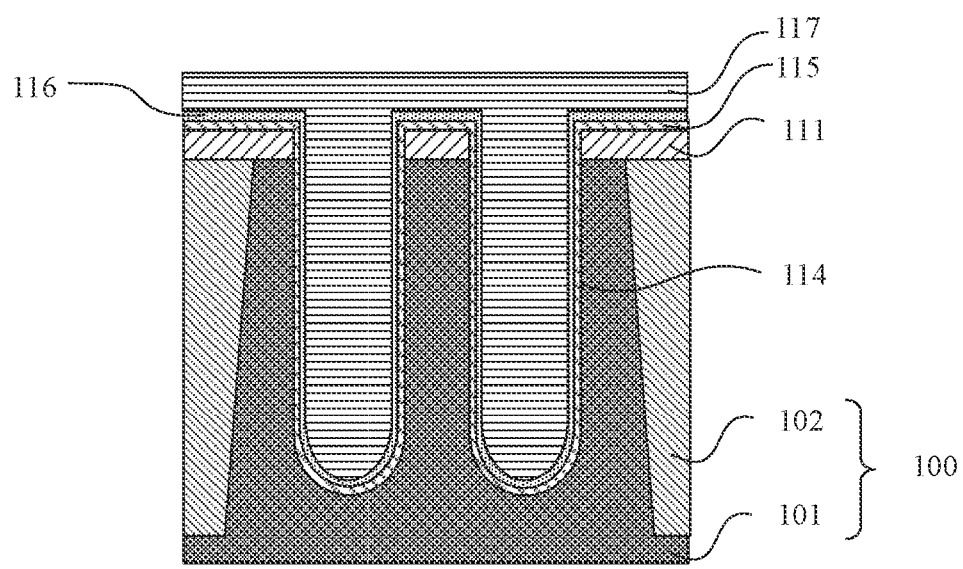
FIG. 7 is a schematic cross-sectional structural diagram of a semiconductor structure obtained after a main conductive material layer is formed according to one embodiment of the present disclosure.

S17: forming a main conductive material layer 117, where the main conductive material layer 117 positioned in the trench 114, the gate oxide material layer 115 positioned in the trench 114, and the stop material layer 116 positioned in the trench 114 jointly fill up the trench 114, as shown in FIG. 7.

Figure 8:
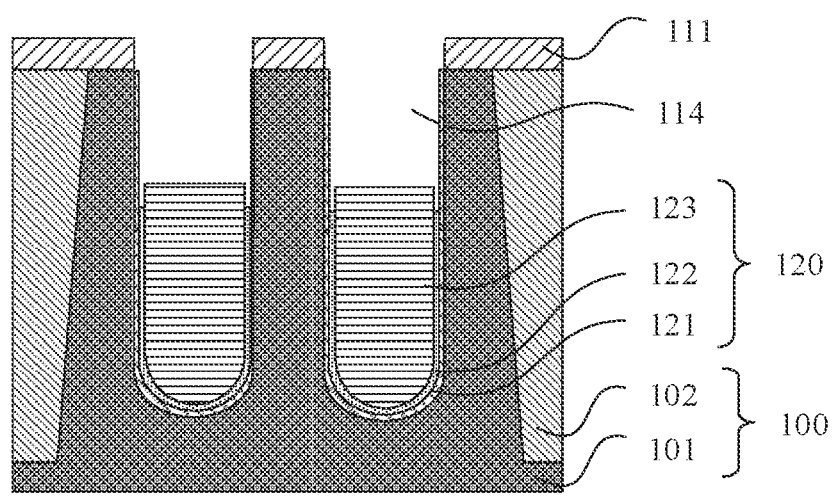
FIG. 8 is a schematic cross-sectional structural diagram of a semiconductor structure obtained after a gate structure is formed in a trench according to one embodiment of the present disclosure.

S18: removing a part positioned in the trench 114, and the main conductive material layer 117, the stop material layer 116 and the gate oxide material layer 115 positioned on the base substrate 100 to form the gate structure 120, as shown in FIG. 8.

In some embodiments, the material for forming the main conductive material layer 117 includes, but is not limited to, metal tungsten. After the main conductive material layer 117, the gate oxide material layer 115, and the stop material layer 116 jointly fill up the trench 114, each of the material layers is etched back. The main conductive material layer 117, the stop material layer 116 and the gate oxide material layer 115 positioned on the base substrate 100 are removed first, and then the main conductive material layer 117, the stop material layer 116 and the gate oxide material layer 115 in the trench 114 are partially etched, to obtain the gate structure 120 jointly constituted by a main conductive layer 123, a barrier layer 122 and a gate oxide layer 121, as shown in FIG. 8. The top surface of the gate oxide layer 121 is flush with the top surface of the trench 114, the top surface of the main conductive layer 123 is lower than the top surface of the trench 114, and the top surface of the barrier layer 122 is lower than the top surface of the main conductive layer 123. A stress problem between a first etch stop layer 131 and the substrate 101 may be reduced by means of the gate oxide layer 121. By controlling the top surface of the barrier layer 122 to be lower than the top surface of the main conductive layer 123, a problem of leakage current of the gate structure may be improved, and thus the performance of the semiconductor device may be improved.

Figure 9:
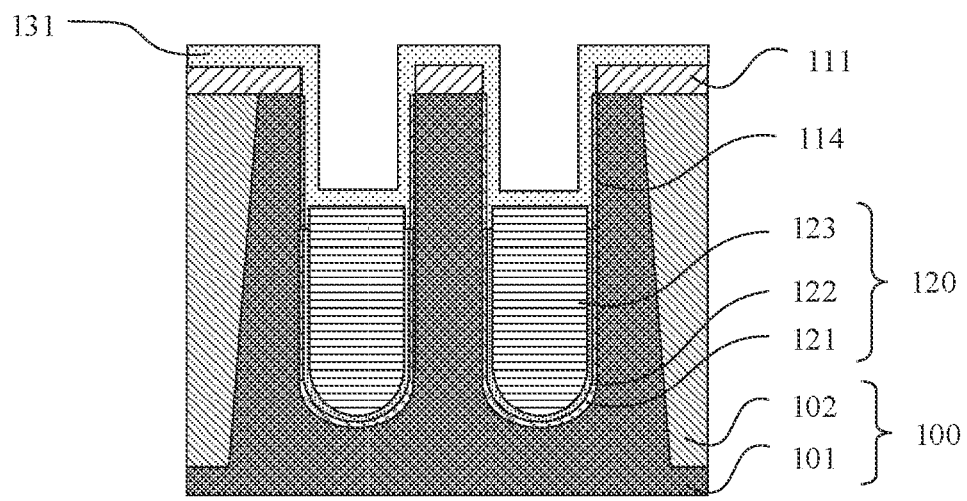
FIG. 9 is a schematic cross-sectional structural diagram of a semiconductor structure obtained after a first etch stop layer is formed according to one embodiment of the present disclosure.

In Step S20, the first etch stop layer 131 is formed, where the first etch stop layer 131 covers the top surface of the gate structure 120, part of the side wall of the trench 114 and the upper surface of the base substrate 100, as shown in FIG. 9. In this embodiment, after the trench 114 is formed, the initial etch stop layer 111 may not need to be removed and may remain on the base substrate 100. In the following text, the upper surface of the base substrate 100 may be understood as the upper surface of the semiconductor structure jointly constituted by the initial etch stop layer 111 and the base substrate 100. For example, the first etch stop layer 131 includes, but is not limited to, a silicon nitride layer, and the first etch stop layer 131 has a thickness of 5 nm to 20 nm, such as 5 nm, 10 nm, 15 nm, or 20 nm. The first etch stop layer 131 may be configured to protect the gate oxide layer 121 and prevent the gate oxide layer 121 from being etched. Meanwhile, the first etch stop layer 131 may also prevent the side wall of the trench 114 from being adversely affected in the subsequent etching process, thereby preventing or reducing the occurrence of electric leakage.

In Step S30, an enclosed isolation structure and an air gap are formed in the trench 114, where the enclosed isolation structure is configured to at least plug an opening of the trench 114, and the air gap is positioned between the enclosed isolation structure and the first etch stop layer 131. The air gap at least comprises a transverse portion, and a bottom of the enclosed isolation structure is positioned on the transverse portion.

In one embodiment, before forming the enclosed isolation structure, the method further comprises forming a sacrificial structure in the trench 114. The step of forming the sacrificial layer includes following steps.

Figure 10:
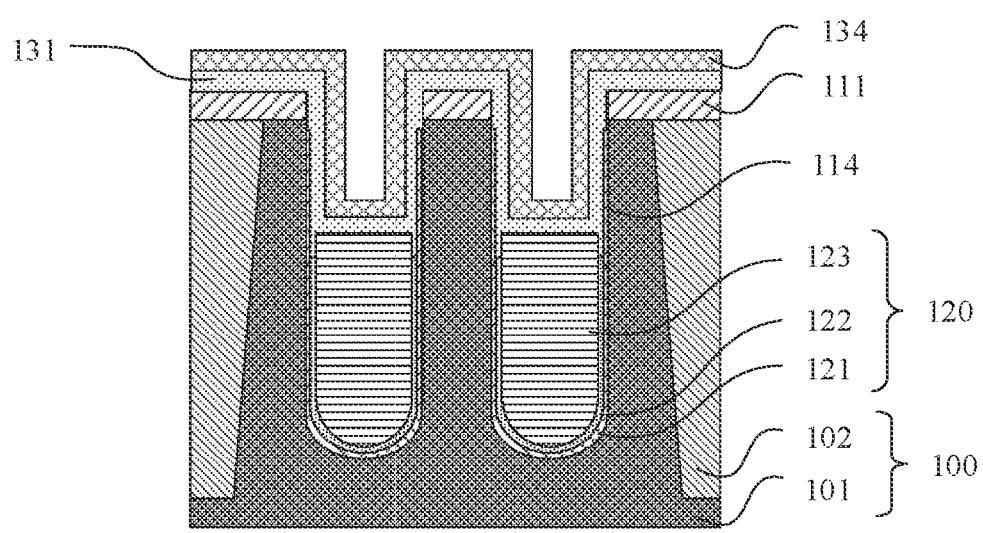
FIG. 10, FIG. 11, FIG. 12a, FIG. 12b, and FIG. 12c are schematic diagrams of a process of forming a sacrificial layer according to one embodiment of the present disclosure.

S311: forming a first sacrificial layer 134 in the trench 114, as shown in FIG. 10.

Figure 11:
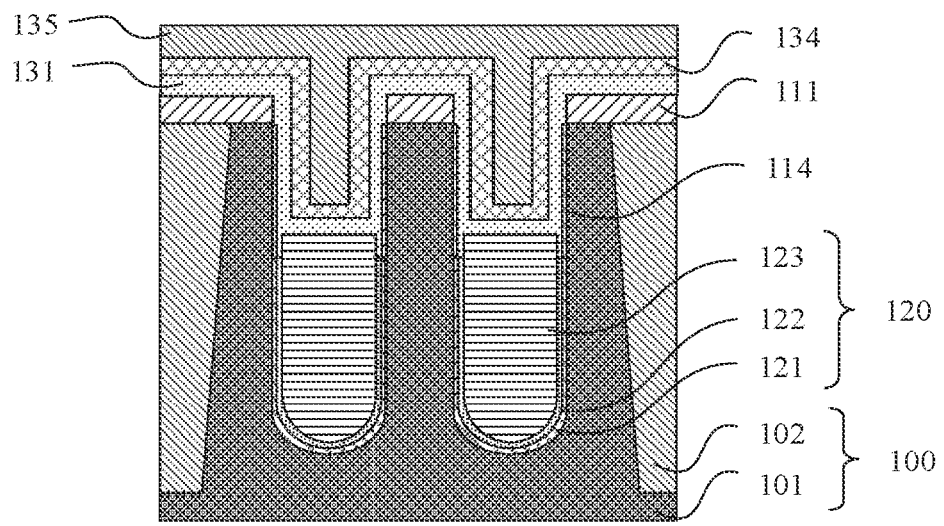

S312: forming a second sacrificial layer 135 on the first sacrificial layer 134 to fill up the trench 114, as shown in FIG. 11.

In some embodiments, the first sacrificial layer 134 includes, but is not limited to, a silicon dioxide layer, and the thickness of the first sacrificial layer 134 may be 5 nm to 20 nm, such as 5 nm, 10 nm, 15 nm or 20 nm. The second sacrificial layer 135 includes, but is not limited to, a spin-on carbon layer (SOC layer).

S313: etching the first sacrificial layer 134 and the second sacrificial layer 135, such that a top surface of the first sacrificial layer 134 is lower than that of the second sacrificial layer 135, where an etching rate of the first sacrificial layer 134 is greater than that of the second sacrificial layer 135.

Figure 12A:
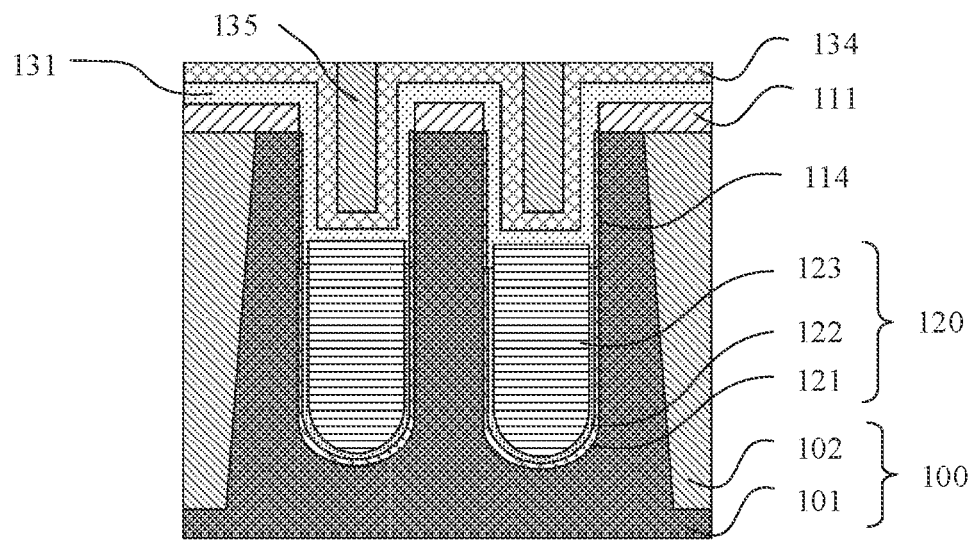

For example, the second sacrificial layer 135 may be etched back first, such that the upper surface of the second sacrificial layer 135 is flush with the upper surface of the first sacrificial layer 134, as shown in FIG. 12*a*. In the process of etching back the second sacrificial layer 135, an etching selectivity of the second sacrificial layer 135 (such as the SOC layer) to the first sacrificial layer 134 (such as a silicon dioxide layer) is greater than 0. By controlling the etching selectivity of the SOC layer to the silicon dioxide layer to be greater than 0, the etching of the silicon dioxide layer may be reduced when the SOC layer is etched back, to obtain an ideal semiconductor structure. In some embodiments, the upper surface of the second sacrificial layer 135 may be flush with the upper surface of the first sacrificial layer 134 by means of a chemical mechanical polishing process.

Figure 12B:
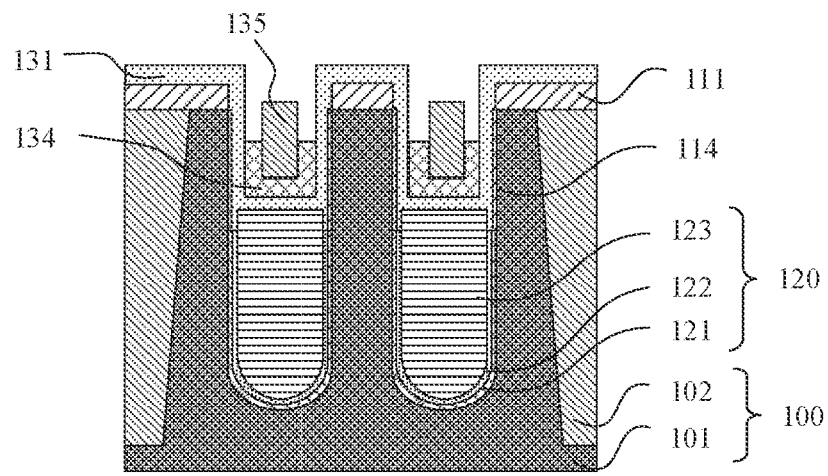

Furthermore, the first sacrificial layer 134 (such as the silicon dioxide layer) is etched by using the second sacrificial layer 135 (such as the SOC layer) and the first etch stop layer 131 (such as the silicon nitride layer) as the mask layer, such that the top surface of the first sacrificial layer 134 is lower than the top surface of the second sacrificial layer 135, as shown in FIG. 12b. The etching rate of the first sacrificial layer 134 is greater than that of the second sacrificial layer 135, for example, the etching selectivity of the silicon dioxide layer to the SOC layer may be 5 to 10, such as 5, 7, 9, or 10. For example, the etching selectivity of the silicon dioxide layer to the silicon nitride layer may be 5 to 20, such as 5, 10, 15, or 20. By controlling the etching selectivity of the silicon dioxide layer to the SOC layer to be less than that of the silicon dioxide layer to the silicon nitride layer, part of the SOC layer may be properly removed by etching during etching the silicon dioxide layer, and simultaneously, the silicon nitride layer is etched as less as possible to obtain the semiconductor structure as shown in FIG. 12b. Part of the first sacrificial layers 134 positioned on the two sides of the second sacrificial layer 135 are equal in height.

Figure 12C:
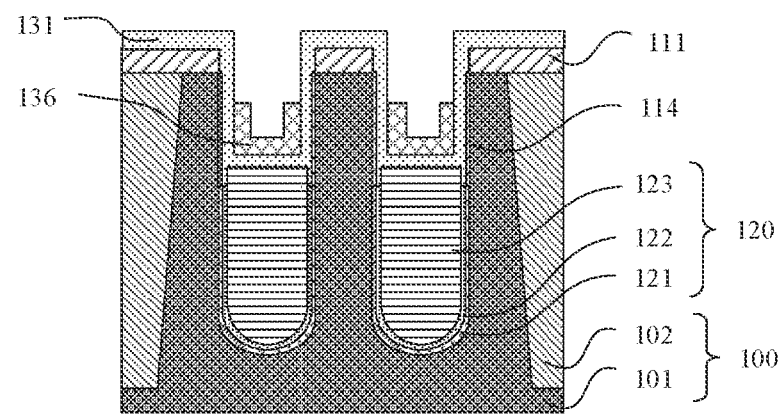

S314: removing the second sacrificial layer 135, and defining a remaining part of the first sacrificial layer 134 as the sacrificial layer 136, as shown in FIG. 12c.

For example, the etching selectivity of the SOC layer to the silicon dioxide layer and the silicon nitride layer is increased to completely remove the SOC layer by etching. By controlling the etching selectivity of the SOC layer to the silicon dioxide layer, an etching degree of the silicon dioxide layer may be controlled when the SOC layer is removed, thereby obtaining the sacrificial layers 136 having different heights and different thicknesses. The sacrificial layers 136 are, for example, concave in shape.

In one embodiment, the sacrificial layers 136 on the side wall of the trench 114 have equal height, as shown in FIG. 12c.

In one embodiment, the step of forming the enclosed isolation structure includes: S321: forming a second etch stop layer in the trench, where the second etch stop layer exposes part of the first etch stop layers; and S322: forming an enclosed isolation layer in the second etch stop layer, where a bottom of the enclosed isolation layer is higher than or as high as a bottom of the second etch stop layer.

In Step S321, the step of forming the second etch stop layer includes following steps.

Figure 13:
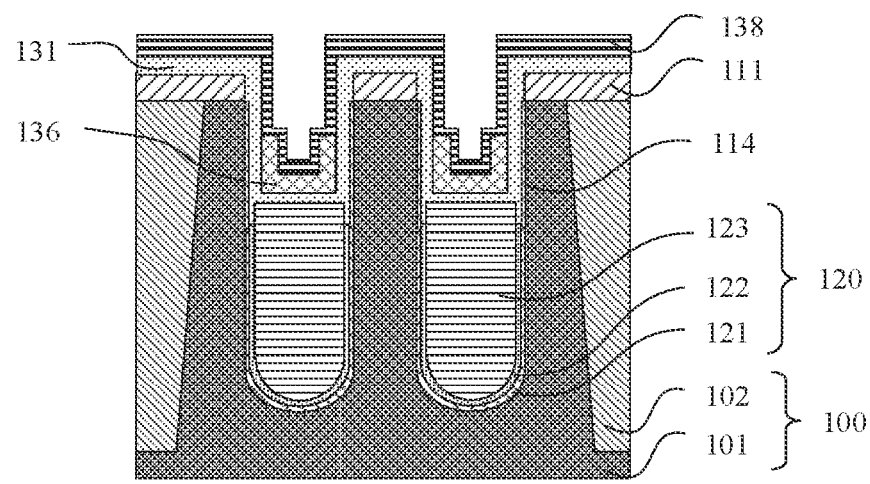
FIG. 13 is a schematic cross-sectional structural diagram of a semiconductor structure obtained after a second etch stop material layer is formed according to one embodiment of the present disclosure.

S321a: forming a second etch stop material layer 138, where the second etch stop material layer 138 covers an exposed surface of the first etch stop layer 131 and the surface of the sacrificial layer 136, as shown in FIG. 13.

For example, the second etch stop material layer 138 includes, but is not limited to, a silicon nitride layer, and a thickness of the second etch stop material layer 138 is 2 nm to 8 nm, such as 2 nm, 4 nm, 6 nm or 8 nm.

Figure 14:
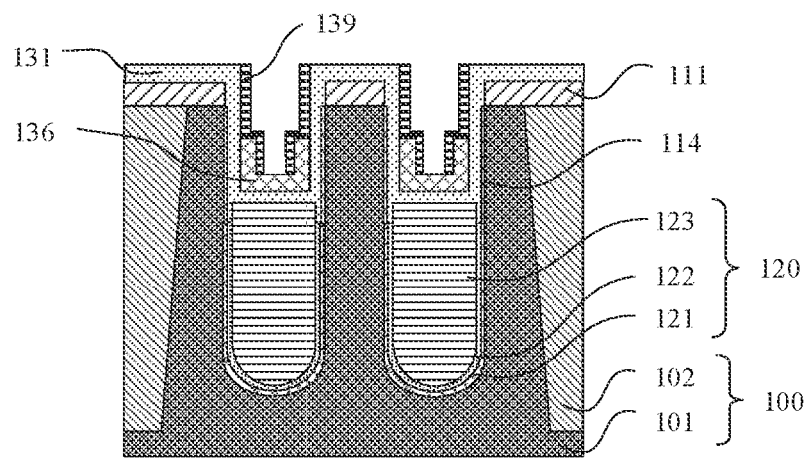
FIG. 14 is a schematic cross-sectional structural diagram of a semiconductor structure obtained after a second etch stop layer is formed according to one embodiment of the present disclosure.

S321b: removing the second etch stop material layer 138 on the upper surface of the first etch stop layer 131 and part of the second etch stop material layer 138 on the upper surface of the sacrificial layer 136 to obtain a second etch stop layer 139, as shown in FIG. 14.

For example, the second etch stop material layer 138 is etched back, such that the second etch stop material layer 138 positioned outside the trench 114 and positioned on the upper surface of the first etch stop layer 131 is removed, and part of the second etch stop material layer 138 positioned in the trench 114 and positioned on the upper surfaces of the sacrificial layers 136 is removed to obtain a second etch stop layer 139, and the second etch stop layer 139 exposes part of the sacrificial layers 136, as shown in FIG. 14. Meanwhile, due to the existence of the sacrificial layers 136, the second etch stop layer 139 shows a shape wider at top and narrower at bottom. That is, a width of an upper part of the second etch stop layer 139 is greater than that of a lower part of the second etch stop layer 139. Therefore, when a material is deposited in the trench 114, the bottom of the second etch stop layer 139 may be sealed more easily because the lower part of the second etch stop layer 139 is narrower.

Figure 15:
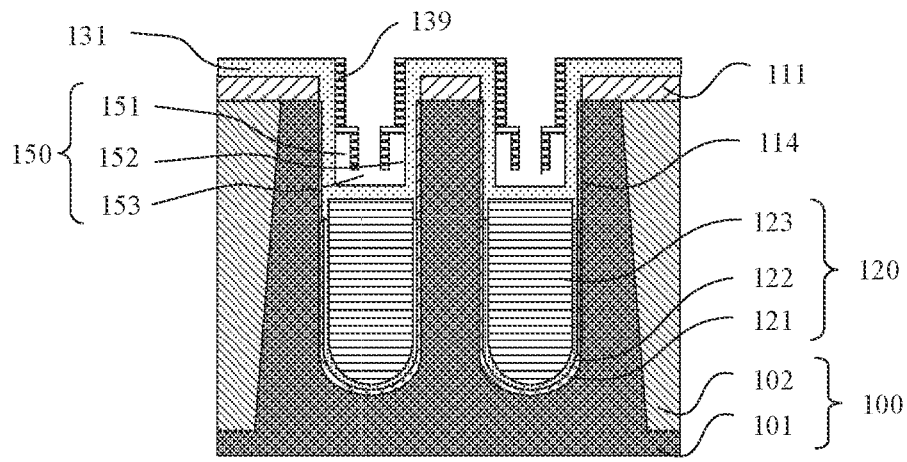
FIG. 15 is a schematic cross-sectional structural diagram of a semiconductor structure obtained after a sacrificial layer is removed according to one embodiment of the present disclosure.

In Step S322, before forming the enclosed isolation layer, the method further includes: removing the sacrificial layer 136 by means of a wet process to form an air gap 150, as shown in FIG. 15.

In some embodiments, when the sacrificial layer 136 is formed, a transverse part of the sacrificial layer 136 may be inclined, and therefore, the transverse portion 153 formed may also be inclined, and the area of the air gap may also be increased by means of the inclined transverse portion 153, and thus the isolation effect can be improved.

As shown in FIG. 15, in one embodiment, the sacrificial layer 136 is completely removed by means of a wet etching process to obtain the air gap 150. The air gap 150 includes the transverse portion 153, a first vertical portion 151, and a second vertical portion 152. The first vertical portion 151 and the second vertical portion 152 are equal in height.

Figure 16:
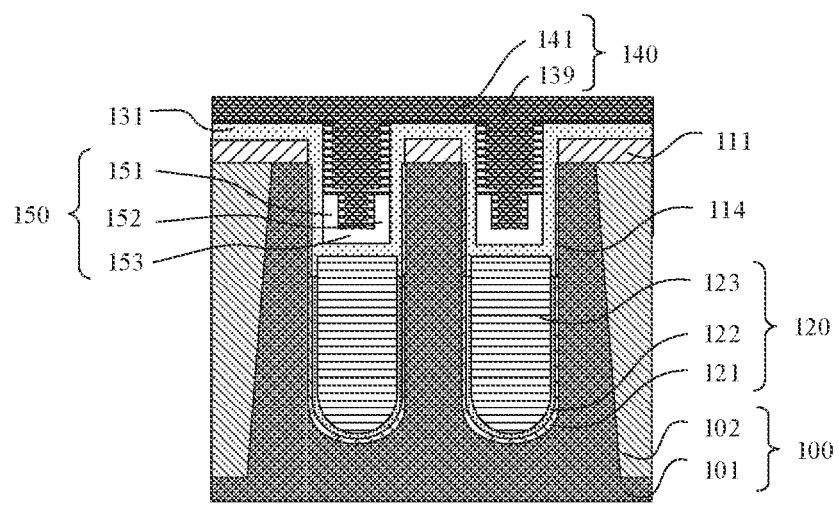
FIG. 16 is a schematic cross-sectional structural diagram of a semiconductor structure obtained after an enclosed isolation structure is formed according to one embodiment of the present disclosure.

After the air gap 150 is formed, an enclosed isolation layer 141 is formed in the second etch stop layer 139, where the bottom of the enclosed isolation layer 141 is higher than or as high as the bottom of the second etch stop layer 139, as shown in FIG. 16.

For example, an isolation material may be filled between the second etch stop layers 139 in the trench 114 by means of a rapid sealing process, and a planarization process is performed on the upper surface of the isolation material to form a sealing isolation layer 141. The sealing isolation layer 141 and the second etch stop layer 139 jointly constitute the enclosed isolation structure 140. The bottom of the sealing isolation layer 141 is higher than the bottom of the second etch stop layer 139, or the bottom of the sealing isolation layer 141 is flush with the bottom of the second etch stop layer 139. The isolation material may include, but is not limited to, silicon nitride.

In one embodiment, as shown in FIG. 16, the width of the upper part of the enclosed isolation structure 140 is greater than the width of the lower part of the enclosed isolation structure 140.

According to the above method for fabricating the semiconductor structure, by skillfully designing the shapes of the sacrificial layers 136, the second etch stop layer 139 having a stepped shape and a wide top and a narrow bottom may be formed in the trench 114, such that when the isolation material is filled to form a sealing isolation layer 141, the process difficulty is reduced, the filling degree of the isolation material is better controlled, and the bottom of the sealing isolation layer 141 is ensured to be higher than the bottom of the second etch stop layer 139 or to be flush with the bottom of the second etch stop layer 139, thereby reducing the situation that the isolation material fills the air gap 150, i.e., preventing the isolation material from contacting the first etch stop layer 131 on the gate structure 120. In this embodiment, the material of the first etch stop layer 131 and the materials of the sacrificial layers 136 are different, and therefore, the first etch stop layer 131 may not be affected when the sacrificial layers 136 are etched. The first etch stop layer 131 may also be configured to protect the gate structure 120, which prevents the material of the main conductive layer 123 from diffusing out, and may also improve the short circuit between a bit line contact window formed subsequently and the gate structure 120.

In one embodiment, the air gap 150 further includes a first vertical portion 151 and a second vertical portion 152 communicate with each other through the transverse portion 153, where the first vertical portion 151 and the second vertical portion 152 are respectively positioned between the first etch stop layer 131 and the enclosed isolation structure 140, as shown in FIG. 16.

After the sealing isolation layer 141 is formed, the complete enclosed isolation structure 140 is obtained. The first vertical portion 151 and the second vertical portion 152 are positioned between the enclosed isolation structure 140 and the first etch stop layer 131. The first vertical portion 151 and the second vertical portion 152 are respectively positioned on two opposite sides of the lower part of the enclosed isolation structure 140, and the first vertical portion 151 and the second vertical portion 152 are communicated by means of the transverse portion 153. The first vertical portion 151, the second vertical portion 152 and the transverse portion 153 jointly constitute the air gap 150.

In one embodiment, the height of the first vertical portion 151 and the height of the second vertical portion 152 are the same, as shown in FIG. 16. In some embodiments, the height of the first vertical portion 151 and the height of the second vertical portion 152 are different.

According to the above method for fabricating the semiconductor structure, by providing the air gap in the trench where the buried gate is positioned, the active areas on the two sides of the gate are better isolated by using the characteristics of minimum dielectric constant and good isolation effect of air, thereby reducing the coupling effect between the adjacent metal gates. In addition, the air gap has the transverse portion, which can increase the area of the air isolation and the width of the transverse isolation, such that the isolation effect is better, and the coupling effect is lower.

In one embodiment of the present disclosure, another method for forming the sacrificial layer 136 is further disclosed. For example, after forming the second sacrificial layer 135, the following steps are performed.

Figure 17:
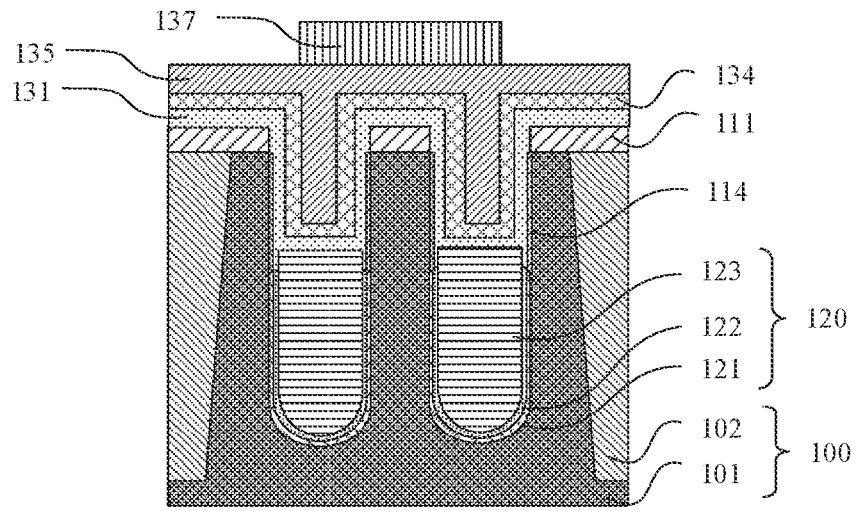
FIG. 17 to FIG. 21 are schematic diagrams of a process of forming a sacrificial layer according to another embodiment of the present disclosure.

S313a: forming a photoresist layer 137 on the second sacrificial layer 135, where the photoresist layer 137 only covers the first sacrificial layer 134 positioned on one side of the second sacrificial layer 135, as shown in FIG. 17.

By precisely controlling the coverage of the photoresist layer 137, as shown in FIG. 17, the side wall of the photoresist layer 137 is aligned with the outer side wall of the second sacrificial layer 135 in the trench 114, such that only part of the first sacrificial layer 134 may be covered.

S313b: etching the second sacrificial layer 135 and the first sacrificial layer 134, and removing the photoresist layer 137, such that the heights of the first sacrificial layers 134 positioned on two sides of the second sacrificial layer 135 are not equal.

Figure 18:
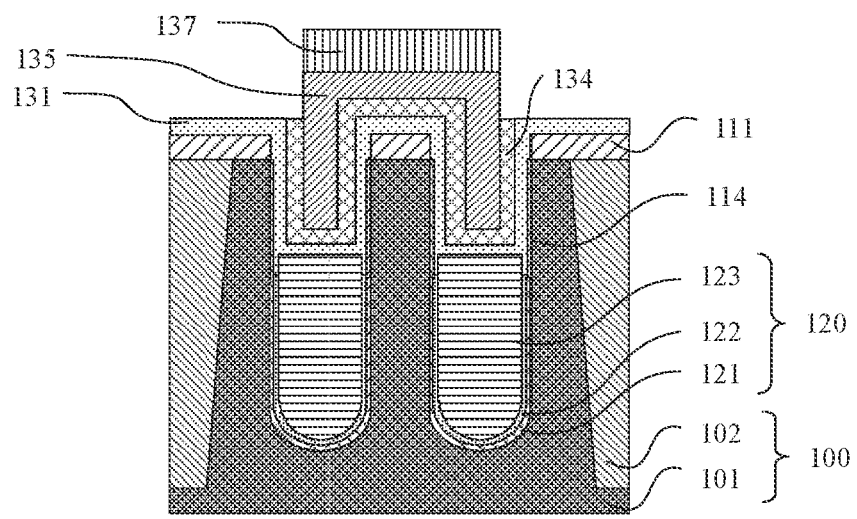

For example, part of the first sacrificial layer 134 and part of the second sacrificial layer 135 are etched on the basis of the photoresist layer 137 to expose part of the upper surface of the first etch stop layer 131, as shown in FIG. 18. The etching selectivity of the first sacrificial layer 134 to the photoresist layer 137 and the etching selectivity of the second sacrificial layer 135 to the photoresist layer 137 are both greater than 1.

Figure 19:
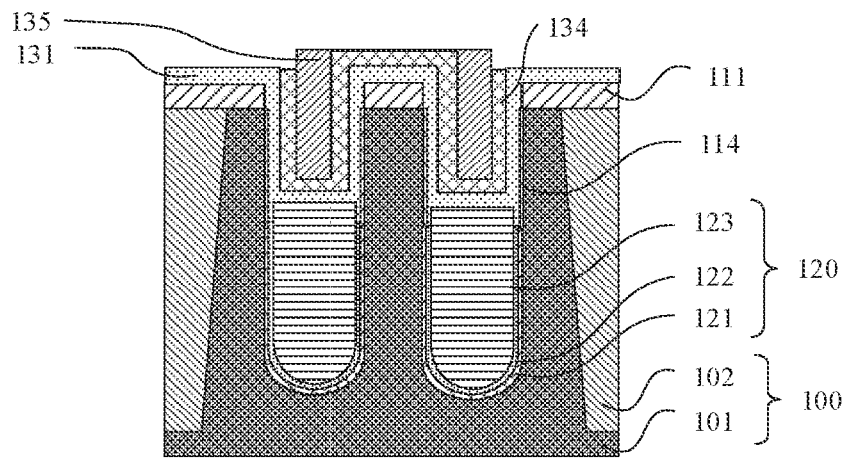

Furthermore, the photoresist layer 137 is removed, and the second sacrificial layer 135 is continuously etched to remove the second sacrificial layer 135 on the upper surface of the base substrate 100 to obtain the semiconductor structure shown in FIG. 19. The heights of the first sacrificial layers 134 positioned on two sides of the second sacrificial layer 135 are not equal.

Figure 20:
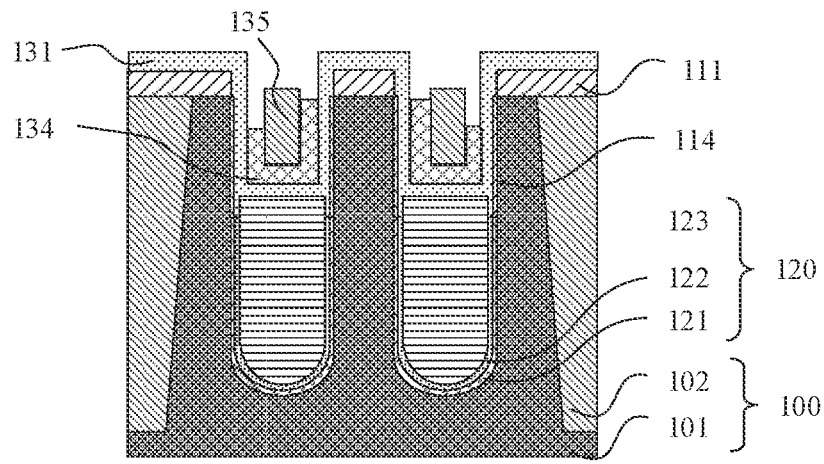

S313c: continuing etching the first sacrificial layer 134 and the second sacrificial layer 135, such that the top of the second sacrificial layer 135 is higher than the top of the first sacrificial layer 134, as shown in FIG. 20.

For example, on the basis of the semiconductor structure shown in FIG. 19, the first sacrificial layer 134 (such as the silicon dioxide layer) is etched by using the second sacrificial layer 135 (such as the SOC layer) and the first etch stop layer 131 (such as the silicon nitride layer) as the mask layer. For example, the etching selectivity of the silicon dioxide layer to the SOC layer may be 5 to 10, and the etching selectivity of the silicon dioxide layer to the silicon nitride layer may be 5 to 20, such as 5, 10, 15, or 20. By controlling the etching selectivity of the silicon dioxide layer to the SOC layer to be 5 to 10, and the etching selectivity of the silicon dioxide layer to the silicon nitride layer to be 5 to 20, in the etching process, the etching speed of the silicon dioxide layer may be increased, and the etching speed of the SOC layer and the nitride layer may be reduced, to achieve the purpose of mainly etching the silicon dioxide layer. Moreover, the etching selectivity of the silicon dioxide layer to the silicon nitride layer may be greater than that of the silicon dioxide layer to the SOC layer, such that in the process of etching the silicon dioxide layer, part of the SOC layer is appropriately etched, and the silicon nitride layer is etched as little as possible, to obtain the semiconductor structure shown in FIG. 20. The parts of the first sacrificial layer 134 positioned on two sides of the second sacrificial layer 135 have a height difference. For example, the height difference may be 5 nm to 20 nm, such as 5 nm, 10 nm, 15 nm, or 20 nm.

Figure 21:
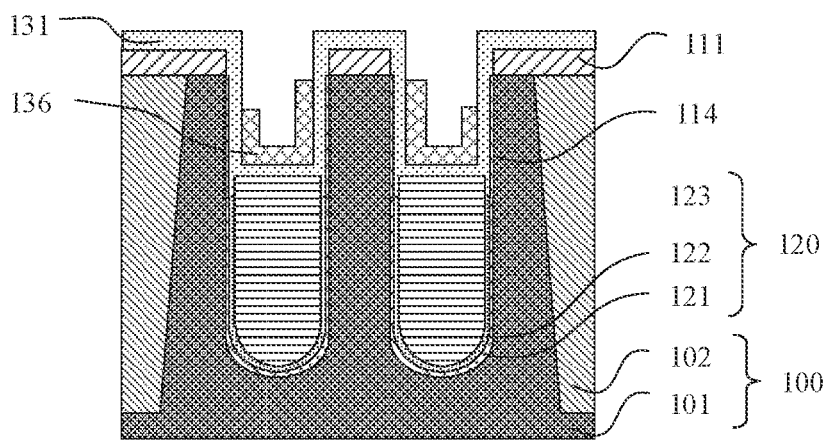

S313d: removing the second sacrificial layer 135 to define the remaining part of the first sacrificial layer 134 as the sacrificial layers 136, as shown in FIG. 21.

For example, the etching selectivity of the SOC layer to the silicon dioxide layer and the silicon nitride layer is increased to completely remove the SOC layer by etching. By controlling the etching selectivity of the SOC layer to the silicon dioxide layer, the etching degree of the silicon dioxide layer may be controlled, thereby obtaining the sacrificial layers 136 having different heights and different thicknesses. In this embodiment, the heights of the sacrificial layers 136 positioned on the side wall of the trench 114 are not equal, as shown in FIG. 21.

Figure 22:
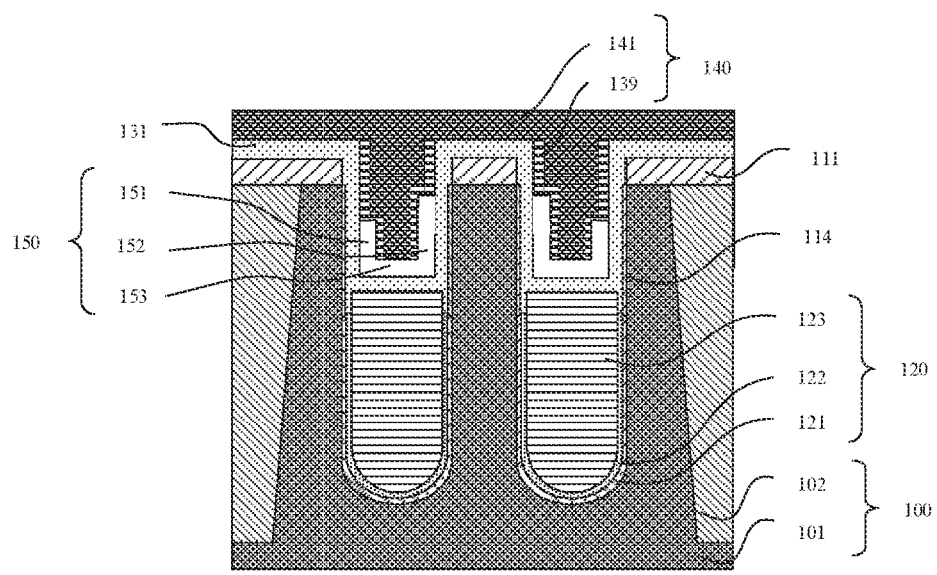
FIG. 22 is a schematic cross-sectional structural diagram of a semiconductor structure obtained after an enclosed isolation structure is formed according to another embodiment of the present disclosure.

After the sacrificial layer 136 is formed, the second etch stop layer 139 and the sealing isolation layer 141 are sequentially formed on the basis of the same steps as S321 and S322 in the above embodiment, to form the semiconductor structure having the air gap 150, as shown in FIG. 22.

In this embodiment, by improving the fabrication process of the sacrificial layer 136, vertical portions having different heights may be formed in the air gap 150. As shown in FIG. 22, the height of the second vertical portion 152 is greater than that of the first vertical portion 151. By means of the semiconductor structure formed by means of the above method, the volume of the air gap may be further increased, the isolation effect may be enhanced, and the coupling effect between the adjacent metal gates may be further reduced.

Figure 23:
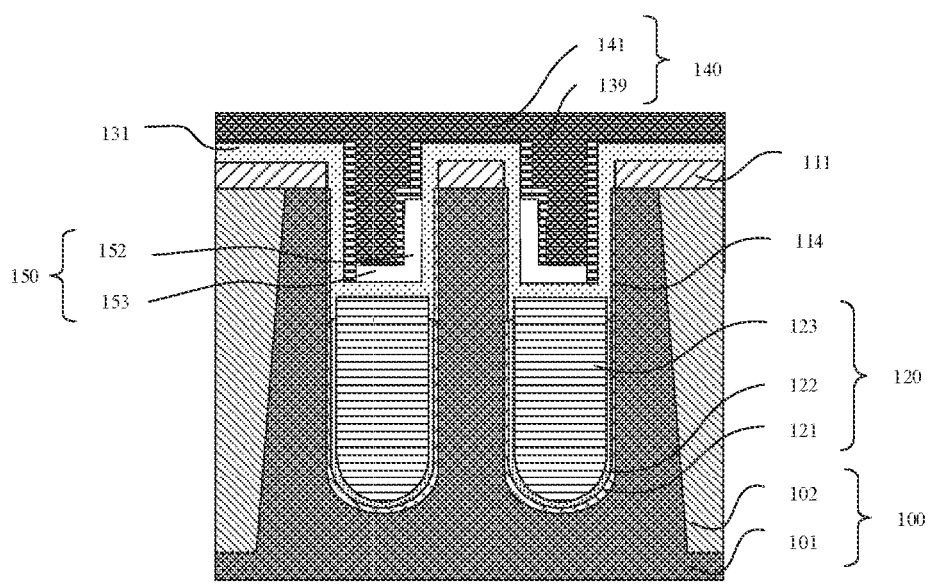
FIG. 23 is a schematic cross-sectional structural diagram of a semiconductor structure obtained after an enclosed isolation structure is formed according to another embodiment of the present disclosure.

As shown in FIG. 17, FIG. 18, and FIG. 23, in some embodiments, a photoresist layer 137 is first formed on the second sacrificial layer 135, where the photoresist layer 137 does not completely cover the second sacrificial layer 135. Taking the trench 114 on the left in FIG. 17 as an example, the photoresist layer 137 exposes a left region of the second sacrificial layer 135. That is, the photoresist layer 137 exposes the first sacrificial layer 134 positioned on the left side of the second sacrificial layer 135. Next, the second sacrificial layer 135 exposed is etched by using the photoresist layer 137 as a mask, and then the first sacrificial layer 134 is etched, such that the first sacrificial layer 134 positioned on the left side of the second sacrificial layer 135 may be completely etched away to expose the first etch stop layer 131 at the bottom, and therefore, a gap may be formed on the left side of the second sacrificial layer 135. In this embodiment, the first sacrificial layer 134 may be etched by means of a dry etching process, such that the process time may be reduced. Next, The enclosed isolation layer 140 is formed in the trench 114. Because the first sacrificial layer 134 on the left side of the second sacrificial layer 135 is etched away, the enclosed isolation layer 140 may be in contact with the side wall of the trench 114. That is, the enclosed isolation layer 140 may be in contact with the first etch stop layer 131, such that no air gap may be formed on the left side of the second sacrificial layer 135. Similarly, in the trench 114 on a right side of FIG. 17, the first sacrificial layer 134 on a right side of the second sacrificial layer 135 is also completely removed by etching to expose the first etch stop layer 131 at the bottom, such that a gap is formed on the right side of the second sacrificial layer 135. After the enclosed isolation layer 140 is formed, the enclosed isolation layer 140 fills up the gap, such that no air gap is formed on the right side of the second sacrificial layer 135, as shown in FIG. 23.

As shown in FIG. 23, in some embodiments, the air gap 150 includes a transverse portion 153 and a second vertical portion 152, where the second vertical portion 152 is communicated with the transverse portion 153. For the step of forming the air gap 150, reference may be made to the above description, which will not be described herein. The air gap 150 includes only the second vertical portion 152, which may achieve the isolation effect.

Another embodiment of the present disclosure discloses a semiconductor structure, as shown in FIG. 16. The semiconductor structure includes a base substrate 100, a first etch stop layer 131, an enclosed isolation structure 140, and an air gap 150. The base substrate 100 includes a trench 114, a gate structure 120 is formed in the trench 114, and a top surface of the gate structure 120 is lower than that of the trench 114. The first etch stop layer 131 covers the top surface of the gate structure 120, part of the side wall of the trench 114 and the upper surface of the base substrate 100. The enclosed isolation structure 140 is positioned between the first etch stop layers 131 in the trench 114, and the enclosed isolation structure 140 at least plugs the opening of the trench 114. The air gap 150 is positioned between the first etch stop layer 131 and the enclosed isolation structure 140, the air gap 150 at least includes the transverse portion 153, and the bottom of the enclosed isolation structure 140 is positioned on the transverse portion 153. In some embodiments, the transverse portion 153 is, for example, a horizontal portion or an inclined portion.

According to the above semiconductor structure, by providing the air gap in the trench where a buried gate is positioned, the active areas on the two sides of the gate are better isolated by using characteristics of minimum dielectric constant and good isolation effect of air, thereby reducing a coupling effect between adjacent metal gates. Moreover, because the air gap 150 is provided with the transverse portion, the area of air isolation and the width of transverse isolation may be increased, such that the isolation effect is better, and the coupling effect is lower.

For example, the base substrate 100 in this embodiment includes, but is not limited to, a silicon substrate. Materials for forming the first etch stop layer 131 and the enclosed isolation structure 140 include, but are not limited to, silicon nitride. By arranging the air gap 150 between the enclosed isolation structure 140 and the first etch stop layer 131, the characteristics of lower dielectric constant and better isolation effect of air can be fully utilized, and the active areas on the two sides of the gate can be better isolated, such that the coupling effect between adjacent metal gates is reduced. Moreover, because the air gap 150 is provided with the transverse portion, the area of air isolation and the width of transverse isolation may be increased, such that the isolation effect is better, and the coupling effect is lower.

In one embodiment, with continued reference to FIG. 16, the air gap 150 further includes: a first vertical portion 151 and a second vertical portion 152, which are respectively positioned on two opposite sides of the lower part of the enclosed isolation structure 140. A bottom of the first vertical portion 151 and a bottom of the second vertical portion 152 are communicated with the transverse portion 153.

In one embodiment, as shown in FIG. 16, a height of the first vertical portion 151 is equal to that of the second vertical portion 152.

In one embodiment, as shown in FIG. 22, the height of the first vertical portion 151 is not equal to that of the second vertical portion 152. Compared with the semiconductor structure as shown in FIG. 16, the second vertical portion 152 of the air gap 150 in this embodiment is higher than the first vertical portion 151, which can further increase a volume of the air gap, enhance the isolation effect, and further reduce the coupling effect between the adjacent metal gates.

In one embodiment, as shown in FIG. 16, the enclosed isolation structure 140 includes: a second etch stop layer 139 and a sealing isolation layer 141. The second etch stop layer 139 is partially attached to the side wall of the first etch stop layer 131. The sealing isolation layer 141 is positioned between the second etch stop layers 139, and plugs the opening of the trench 114 together with the second etch stop layer 139.

In one embodiment, as shown in FIG. 16, a width of an upper part of the enclosed isolation structure 140 is greater than a width of a lower part of the enclosed isolation structure 140, where the upper part of the second etch stop layer 139 is attached to the side wall of the first etch stop layer 131, and a first pitch is formed between the lower part of the second etch stop layer 139 and the side wall of the first etch stop layer 131.

The enclosed isolation structure 140 wider at the top and narrower at the bottom may ensure the sealing effect on the opening of the trench 114. Moreover, the first pitch is provided between the lower part of the second etch stop layer 139 and the side wall of the first etch stop layer 131. The pitch allows the air gap 150 to have the vertical portion, such that the active areas on the two sides of the gate may be isolated by using the characteristics of lower dielectric constant and better isolation effect of air, thereby reducing the coupling effect between the adjacent metal gates.

In one embodiment, as shown in FIG. 16, the gate structure 120 includes a gate oxide layer 121, a barrier layer 122 and a main conductive layer 123 sequentially stacked from outside to inside, where a top surface of the gate oxide layer 121 is flush with a top surface of the trench 114, a top surface of the main conductive layer 123 is lower than the top surface of the trench 114, and a top surface of the barrier layer 122 is lower than the top surface of the main conductive layer 123. By controlling the top surface of the barrier layer 122 to be lower than the top surface of the main conductive layer 123, a problem of leakage current of the gate structure may be improved, and thus the performance of the semiconductor may be improved.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A semiconductor structure, comprising:
   a base substrate comprising a trench, wherein the trench comprises a gate structure, a top surface of the gate structure being lower than a top surface of the trench;
   first etch stop layers, wherein the first etch stop layers cover the top surface of the gate structure, part of a side wall of the trench, and an upper surface of the base substrate;
   an enclosed isolation structure positioned between the first etch stop layers in the trench, the enclosed isolation structure being configured to at least plug an opening of the trench; and
   an air gap positioned between each of the first etch stop layers and the enclosed isolation structure, the air gap at least comprising a transverse portion, wherein a bottom of the enclosed isolation structure is positioned on the transverse portion.

2. The semiconductor structure according to claim 1, wherein the air gap further at least comprises a vertical portion, the vertical portion being positioned at a lower part of the enclosed isolation structure and being communicated with the transverse portion.

3. The semiconductor structure according to claim 1, wherein the air gap further comprises a first vertical portion and a second vertical portion, the first vertical portion and the second vertical portion being respectively positioned on two opposite sides of a lower part of the enclosed isolation structure, and a bottom of the first vertical portion and a bottom of the second vertical portion being communicated with the transverse portion.

4. The semiconductor structure according to claim 3, wherein a height of the first vertical portion is not equal to a height of the second vertical portion.

5. The semiconductor structure according to claim 1, wherein the enclosed isolation structure comprises:
   second etch stop layers and a sealing isolation layer; wherein
   the second etch stop layers are partially attached to side walls of the first etch stop layers; and
   the sealing isolation layer is positioned between the second etch stop layers, the sealing isolation layer being configured to plug the opening of the trench together with the second etch stop layers.

6. The semiconductor structure according to claim 5, wherein a width of an upper part of each of the second etch stop layers is greater than a width of a lower part of each of the second etch stop layers, the upper part of each of the second etch stop layers being attached to the side wall of each of the first etch stop layers, and a first pitch being formed between the lower part of each of the second etch stop layer and the side wall of each of the first etch stop layers.

7. The semiconductor structure according to claim 1, wherein the gate structure comprises a gate oxide layer, a barrier layer and a main conductive layer sequentially stacked from outside to inside;
   wherein a top surface of the barrier layer is lower than a top surface of the main conductive layer, and the top surface of the main conductive layer is lower than the top surface of the trench.

8. A method for fabricating a semiconductor structure, comprising:
   providing a base substrate, wherein the base substrate comprises a trench, a gate structure being formed in the trench, and a top surface of the gate structure being lower than a top surface of the trench;
   forming first etch stop layers, wherein the first etch stop layers cover the top surface of the gate structure, part of a side wall of the trench, and an upper surface of the base substrate; and
   forming an enclosed isolation structure and an air gap in the trench, wherein the enclosed isolation structure is configured to at least plug an opening of the trench, and the air gap is positioned between the enclosed isolation structure and each of the first etch stop layers;
   wherein the air gap at least comprises a transverse portion, a bottom of the enclosed isolation structure being positioned on the transverse portion.

9. The method for fabricating the semiconductor structure according to claim 8, wherein before forming the enclosed isolation structure, the method further comprises forming a sacrificial layer in the trench; and the forming the sacrificial layer comprises:
   forming a first sacrificial layer in the trench;
   forming a second sacrificial layer on the first sacrificial layer to fill up the trench;
   etching the first sacrificial layer and the second sacrificial layer, such that a top surface of the first sacrificial layer is lower than a top surface of the second sacrificial layer, wherein an etching rate of the first sacrificial layer is greater than an etching rate of the second sacrificial layer; and
   removing the second sacrificial layer, and defining a remaining part of the first sacrificial layer as the sacrificial layer.

10. The method for fabricating the semiconductor structure according to claim 9, wherein heights of the sacrificial layers positioned on the side wall of the trench are equal.

11. The method for fabricating the semiconductor structure according to claim 9, wherein after forming the second sacrificial layer, and before etching the first sacrificial layer and the second sacrificial layer, the method further comprises:

forming a photoresist layer on the second sacrificial layer, wherein the photoresist layer covers only the first sacrificial layer positioned on a side of the second sacrificial layer; and etching the second sacrificial layer and the first sacrificial layer, and removing the photoresist layer, such that heights of the first sacrificial layers positioned on two sides of the second sacrificial layer are not equal.

12. The method for fabricating the semiconductor structure according to claim 9, wherein the forming the enclosed isolation structure comprises:

forming a second etch stop layer in the trench, wherein the second etch stop layer exposes part of the first etch stop layers; and forming an enclosed isolation layer in the second etch stop layer, wherein a bottom of the enclosed isolation layer is higher than or as high as a bottom of the second etch stop layer.

13. The method for fabricating the semiconductor structure according to claim 12, wherein before forming the enclosed isolation layer, the method further comprises:

removing the sacrificial layer by means of a wet process to form the air gap.

14. The method for fabricating the semiconductor structure according to claim 8, wherein a width of an upper part of the enclosed isolation structure is greater than a width of a lower part of the enclosed isolation structure.

15. The method for fabricating the semiconductor structure according to claim 8, wherein the air gap at least comprises a vertical portion, the transverse portion being connected to the vertical portion, and the vertical portion being positioned between each of the first etch stop layers and the enclosed isolation layer.

16. The method for fabricating the semiconductor structure according to claim 15, wherein the air gap comprises a first vertical portion and a second vertical portion, the first vertical portion and the second vertical portion being communicated to each other by means of the transverse portion, and a height of the first vertical portion being equal to or not equal to a height of the second vertical portion.

17. The method for fabricating the semiconductor structure according to claim 16, wherein the first vertical portion and the second vertical portion are respectively positioned between each of the first etch stop layers and the enclosed isolation structure.

* * * * *